United States Patent
Tesi

(10) Patent No.: US 7,052,179 B2
(45) Date of Patent: May 30, 2006

(54) TEMPERATURE DETECTOR

(75) Inventor: Davide Tesi, Ferney-Voltaire (FR)

(73) Assignee: STMicroelectronics S.A., Montrouge (FR)

( * ) Notice: Subject to any disclaimer, the term of this patent is extended or adjusted under 35 U.S.C. 154(b) by 0 days.

(21) Appl. No.: 10/325,513

(22) Filed: Dec. 19, 2002

(65) Prior Publication Data

US 2003/0123520 A1   Jul. 3, 2003

(30) Foreign Application Priority Data

Dec. 28, 2001   (FR) ................................ 01 17036

(51) Int. Cl.
*G01K 7/01* (2006.01)

(52) U.S. Cl. ..................... 374/178; 327/512

(58) Field of Classification Search ............... 374/4, 374/5, 57, 178, 183, 141; 324/760; 257/467, 257/470; 327/83, 512, 513; 307/117

See application file for complete search history.

(56) References Cited

U.S. PATENT DOCUMENTS

| | | | | | |
|---|---|---|---|---|---|
| 3,825,778 | A | * | 7/1974 | Ahmed ...................... 307/117 |
| 4,071,813 | A | * | 1/1978 | Dobkin ...................... 323/226 |
| 4,313,082 | A | * | 1/1982 | Neidorff ..................... 323/312 |
| 4,999,516 | A | * | 3/1991 | Suter et al. ................ 327/539 |
| 5,013,934 | A | * | 5/1991 | Hobrecht et al. ........... 327/527 |
| 5,195,827 | A | * | 3/1993 | Audy et al. ................. 374/172 |
| 5,200,654 | A | * | 4/1993 | Archer ....................... 327/362 |
| 5,477,076 | A | | 12/1995 | Gay et al. |
| 5,589,792 | A | * | 12/1996 | Brokaw ...................... 327/512 |
| 5,639,163 | A | * | 6/1997 | Davidson et al. ........... 374/178 |
| 5,660,474 | A | * | 8/1997 | Kurihara .................... 374/178 |
| 5,918,982 | A | * | 7/1999 | Nagata et al. .............. 374/178 |
| 5,961,215 | A | * | 10/1999 | Lee et al. ................... 374/178 |
| 6,005,424 | A | * | 12/1999 | Douglass .................... 327/143 |
| 6,107,868 | A | * | 8/2000 | Diniz et al. ................. 327/543 |
| 6,118,263 | A | * | 9/2000 | O'Neill et al. .............. 323/315 |
| 6,137,341 | A | * | 10/2000 | Friedman et al. ........... 327/513 |
| 6,157,244 | A | | 12/2000 | Lee et al. |
| 6,205,010 | B1 | * | 3/2001 | Ohsaka et al. .............. 361/103 |
| 6,309,099 | B1 | * | 10/2001 | Chang ........................ 374/183 |

(Continued)

FOREIGN PATENT DOCUMENTS

EP   360333   A2 *   3/1990

(Continued)

OTHER PUBLICATIONS

French Search Report from French Priority application No. 0117036, filed Dec. 28, 2001.

(Continued)

*Primary Examiner*—Christopher W. Fulton
*Assistant Examiner*—Mirellys Jagan
(74) *Attorney, Agent, or Firm*—Lisa K. Jorgenson; William R. McClellan; Wolf, Greenfield & Sacks, P.C.

(57) ABSTRACT

An integrated temperature sensor having a first PNP-type bipolar transistor diode-connected between a first terminal and a second terminal of the sensor intended to be connected to a reference supply rail; a resistive element and a second diode-connected PNP-type bipolar transistor, connected in series between a third terminal of the sensor and the second terminal, the second bipolar transistor being larger than the first one; a current-to-voltage conversion element connected between a fourth terminal and the second terminal, the first and third terminals being intended to be connected by a voltage-copying element and the first, second, and fourth terminals being intended to each receive an identical current.

16 Claims, 4 Drawing Sheets

U.S. PATENT DOCUMENTS

| | | | |
|---|---|---|---|
| 6,554,469 B1 * | 4/2003 | Thomson et al. | 374/178 |
| 6,612,738 B1 * | 9/2003 | Beer et al. | 374/178 |
| 6,628,558 B1 * | 9/2003 | Fiscus | 365/222 |
| 6,674,185 B1 * | 1/2004 | Mizuta | 374/178 |
| 6,759,893 B1 * | 7/2004 | Gailhard et al. | 327/512 |
| 6,786,639 B1 * | 9/2004 | Covi et al. | 374/178 |
| 6,799,889 B1 * | 10/2004 | Pennock | 374/178 |
| 6,856,547 B1 * | 2/2005 | Poidomani et al. | 365/185.21 |
| 6,882,213 B1 * | 4/2005 | Kim | 327/512 |
| 2004/0046538 A1 * | 3/2004 | Sivero et al. | 323/315 |
| 2004/0071183 A1 * | 4/2004 | Tesi et al. | 374/1 |
| 2004/0081224 A1 * | 4/2004 | Umeyama et al. | 374/178 |

FOREIGN PATENT DOCUMENTS

| | | | |
|---|---|---|---|
| EP | 1 081 477 A | 3/2001 | |

OTHER PUBLICATIONS

B.L. Hart, *Automatic Start-up Technique for Complementary PTAT Current Genarators*, Electronics Letters, vol. 18, No. 18, Sep. 2, 1982, pp. 776-777, XP002210645.

* cited by examiner

TEMPERATURE DETECTOR

BACKGROUND OF THE INVENTION

1. Field of the Invention

The present invention generally relates to temperature sensors. More specifically, the present invention relates to the temperature characterization of integrated circuits, that is, the checking of the temperatures at which the circuit operates properly.

2. Discussion of the Related Art

During the final testing steps of an integrated circuit, to check or determine the proper operating temperature range, the integrated circuit is submitted to a specific testing.

FIG. 1 schematically illustrates a device used to test the operating temperature range of a completed integrated circuit (that is, in a package). An integrated circuit 1 to be tested is placed on a support 2 and put in electric connection with a testing tool 3 by a conductive connection 4. A testing temperature is obtained by locally creating a heated or cooled down atmosphere at the desired temperature, projected by a pulsed air pipe 5 as close as possible to circuit 1. Once an atmosphere has been created at the desired temperature, the operation of the integrated circuit is tested by means of external tool 3.

The test is repeated for different temperatures to check, for example, the proper operation of the circuit in the provided range.

A problem posed is to know the real temperature of the integrated circuit and, more specifically, temperatures of semiconductor junctions. On the one hand, the integrated circuit is generally placed in a package which partially protects it from external temperature variations. On the other hand, in operation, the different circuit portions heat differently, which may alter the measurements.

Generally, a sensor integrated with the circuit is used to determine a voltage of which the variation according to temperature is known.

FIG. 2 illustrates such a sensor conventionally used to determine the real temperature of the integrated circuit in an operation test. The sensor includes a PNP-type bipolar transistor 6, integrated in a semiconductor wafer as integrated circuit 1 to be tested (not detailed). Bipolar transistor 6 is diode-connected, its base and its collector being interconnected to a voltage reference rail GND. The emitter of transistor 6 forms an input/output terminal 7 of the sensor. Terminal 7 is connected by connection 4 to external tool 3 which includes a current source 8 to be interposed between emitter terminal 7 and a high voltage supply rail VDD with respect to rail GND. The voltage on terminal 7 is measured, still with respect to the same reference GND.

The voltage thus sampled is the base-emitter voltage $V_{BE}$ of transistor 6. The variation of this voltage according to temperature T of the semiconductor substrate—typically silicon—in which the base-emitter junction is integrated is known according to the following formula:

$$I = I_{sat} \cdot \exp(qV_{BE}/nkT), \text{ where}$$

I is the current imposed by source 8 on emitter 7;

$I_{sat}$ is the saturation current of the base-emitter junction of transistor 6;

q is the atomic charge;

k is Boltzmann's constant; and n is the ideality factor of transistor 6.

The variation of current I being imposed by external tool 3 and voltage $V_{BE}$ being measured, internal temperature T can be determined if the saturation current of junction $I_{sat}$ and the ideality factor are known.

A disadvantage of conventional test cells such as that illustrated in FIG. 2 is that it is necessary to know the characteristics of transistor 6 forming the sensor and especially its saturation current $I_{sat}$. In fact, a range of ideality factors for which current I provided by source 8 provides a result which is assumed to be valid has to be set.

Several distinct tools must then be available according to the ideality factors. Further, there now does not exist any external tool enabling processing all possible ideality factor values. For example, a currently-used testing tool is provided for an integrated circuit having an ideality factor which must range between 1.0057 and 1.0125.

SUMMARY OF THE INVENTION

The present invention aims at providing an integrated sensor of the temperature of a circuit which overcomes the previously-discussed disadvantages.

The present invention also aims at providing such a sensor which exhibits a reduced error margin as compared to known sensors.

The present invention further aims at providing a sensor which is reliable whatever the ideality factor of the transistors.

To achieve these and other objects, the present invention provides an integrated temperature sensor comprising:

a first diode-connected PNP-type bipolar transistor between a first terminal and a second terminal of the sensor intended to be connected to a reference supply rail;

a resistive element and a second diode-connected PNP-type bipolar transistor, connected in series between a third terminal of the sensor and the second terminal, the second bipolar transistor being larger than the first one;

a current-to-voltage conversion element connected between a fourth terminal and the second terminal, the first and third terminals being intended to be connected by a voltage-copying element and the first, second, and fourth terminals being intended to each receive an identical current.

According to an embodiment of the present invention, the sensor includes, integrated, three mirror-connected current sources for providing the identical current to the first, second, and fourth terminals, the voltage-copying element being also integrated to the sensor.

According to an embodiment of the present invention, the voltage-copying element is a voltage mirror formed of two N-channel MOS transistors.

According to an embodiment of the present invention, the conversion element is a resistor.

The present invention also provides a method for testing an operating temperature range of an integrated circuit comprising a sensor according to any of the preceding embodiments and comprising measuring the voltage across the current-to-voltage conversion element.

The foregoing object, features, and advantages of the present invention, will be discussed in detail in the following non-limiting description of specific embodiments in connection with the accompanying drawings.

DETAILED DESCRIPTION

Figure 1:
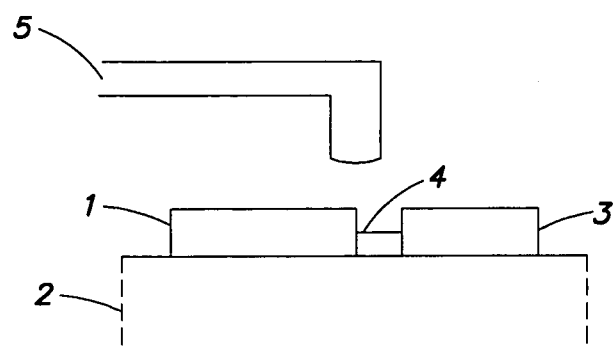
FIG. 1, previously described, schematically illustrates a device for testing an operating temperature range of an integrated circuit.
Figure 2:
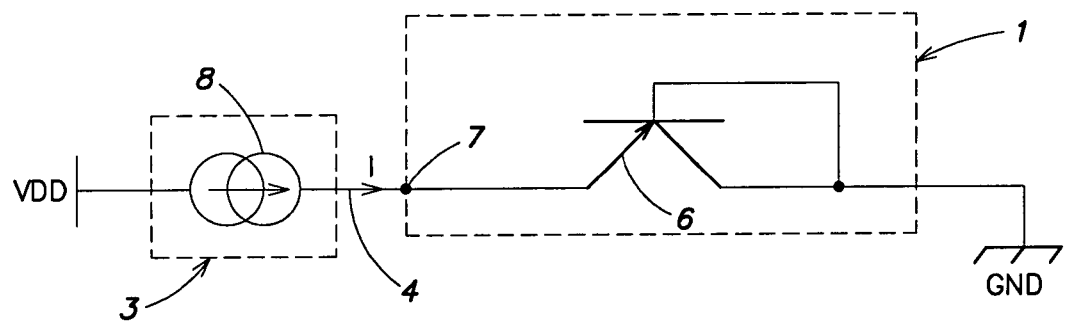
FIG. 2, previously described, illustrates a conventional sensor of the temperature of an integrated circuit.

For clarity, the same elements are designated with the same references in the different drawings. Further, FIG. 1 is not drawn to scale. Moreover, only those elements necessary to the understanding of the present invention have been shown in the drawings and will be described hereafter. In particular, the other components of the circuit on which the sensor is integrated have not been detailed. The present invention applies whatever the type of integrated circuit and the functions that it integrates.

Figure 3:
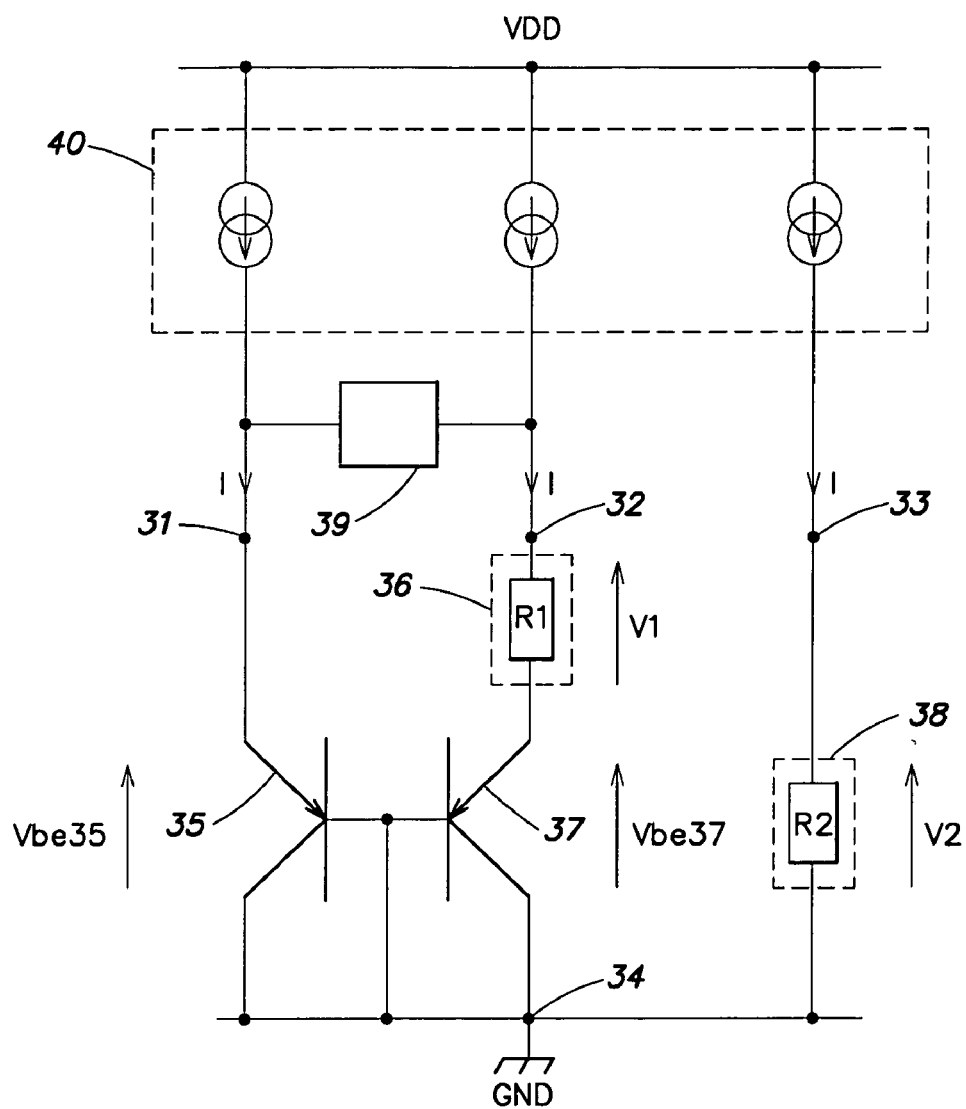
FIG. 3 schematically illustrates a sensor of a voltage varying along with temperature according to the present invention.

FIG. 3 schematically shows a sensor of a voltage varying along with temperature according to the present invention.

This sensor includes a first PNP-type bipolar transistor 35 diode-connected between two terminals 31 and 34 of the sensor. More specifically, a first terminal 31 is connected to the emitter of transistor 35 while its base and its collector are interconnected to a second terminal 34, intended to be connected to a low voltage reference supply rail GND of the integrated circuit.

The sensor also includes a resistive element 36, for example, a resistor having a value $R_1$, and a second diode-connected PNP-type bipolar transistor 37, which are arranged in series between a third terminal 32 and terminal 34. More specifically, resistive element 36 is interposed between terminal 32 and the emitter of transistor 37, the base and the collector of which are interconnected to terminal 34.

According to the present invention, transistors 35 and 37 are of different sizes and an element 39 for copying the voltage of first terminal 31 on second terminal 32 of the sensor is provided.

Finally, a current-to-voltage converter 38 is connected between a fourth terminal 33 and terminal 34 of the sensor. For example, current-to-voltage converter 38 is a resistor having a value $R_2$.

Terminals 31, 32, and 33 are intended to each receive an identical current I. Identical current I is provided by a current source 40 to three identical outputs interposed between a positive supply rail $V_{DD}$ and each of terminals 31, 32, and 33.

The operating principle of the sensor is described hereafter.

Between terminals 31 and 34, that is, in a first branch of the sensor, current I imposed by source 40 follows the following rule:

$I = I_{sat35} \cdot \exp(qV_{BE35}/n_{35}kT)$, where $I_{sat35}$ is the saturation current of the base-emitter junction of transistor 35;
$V_{BE35}$ is the base-emitter voltage of transistor 35;
q is the atomic charge;
k is Boltzmann's constant; and
$n_{35}$ is the ideality factor of transistor 35.

Between terminals 32 and 34, that is, in a second branch of the sensor, current I follows the two following rules:

in resistive element 36, $V_1 = R_1 I$, where $V_1$ is the voltage drop across resistor 36; and in transistor 37, $I = I_{sat37} \exp(qV_{BE37}/n_{37}kT)$, where $I_{sat37}$, $V_{BE37}$, and $n_{37}$ respectively designate the saturation current, the base-emitter voltage and the ideality factor of transistor 37.

Bipolar transistors 35 and 37 are of the same type and they are assumed to be formed simultaneously. The size ratio A between transistors 35 and 37 such that $I_{sat37} = A \cdot I_{sat35}$ is thus known. The following relation is then obtained:

$A = \exp\{q[(V_{BE35}/n_{35}) - (V_{BE37}/n_{37})]/kT\}$.

Since transistors 35 and 37 are formed simultaneously and are of the same type, it can be said that $n_{35} = n_{37} = n$.

The following relation is then obtained:

$V_{BE35} - V_{BE37} = [nkT \cdot \ln(A)]/q$.

On the other hand, voltage $V_1$ across resistor 36 is equal to the voltage difference between the base-emitter junction of transistor 37 and the voltage of point 32. The copying by element 39 of the voltage of terminal 31 on terminal 32 enables writing:

$V_1 = V_{BE35} - V_{BE37}$.

Finally, between terminals 33 and 34, current I follows Ohm's rule $V_2 = R_2 \cdot I$, where $V_2$ is the voltage drop across resistor 38.

There then is:

$I = V_2/R_2 = V_1/R_1$, where $V_1 = [nkT \cdot \ln(A)]/q$.

To determine the value of temperature T, it is then sufficient to determine the sole unknown of the preceding equation, that is, voltage $V_2$ across resistor 38. For this purpose, it is enough to measure by means of an external tool the voltage on terminal 33, taking as a voltage reference the same reference GND as the integrated circuit.

Figure 4:
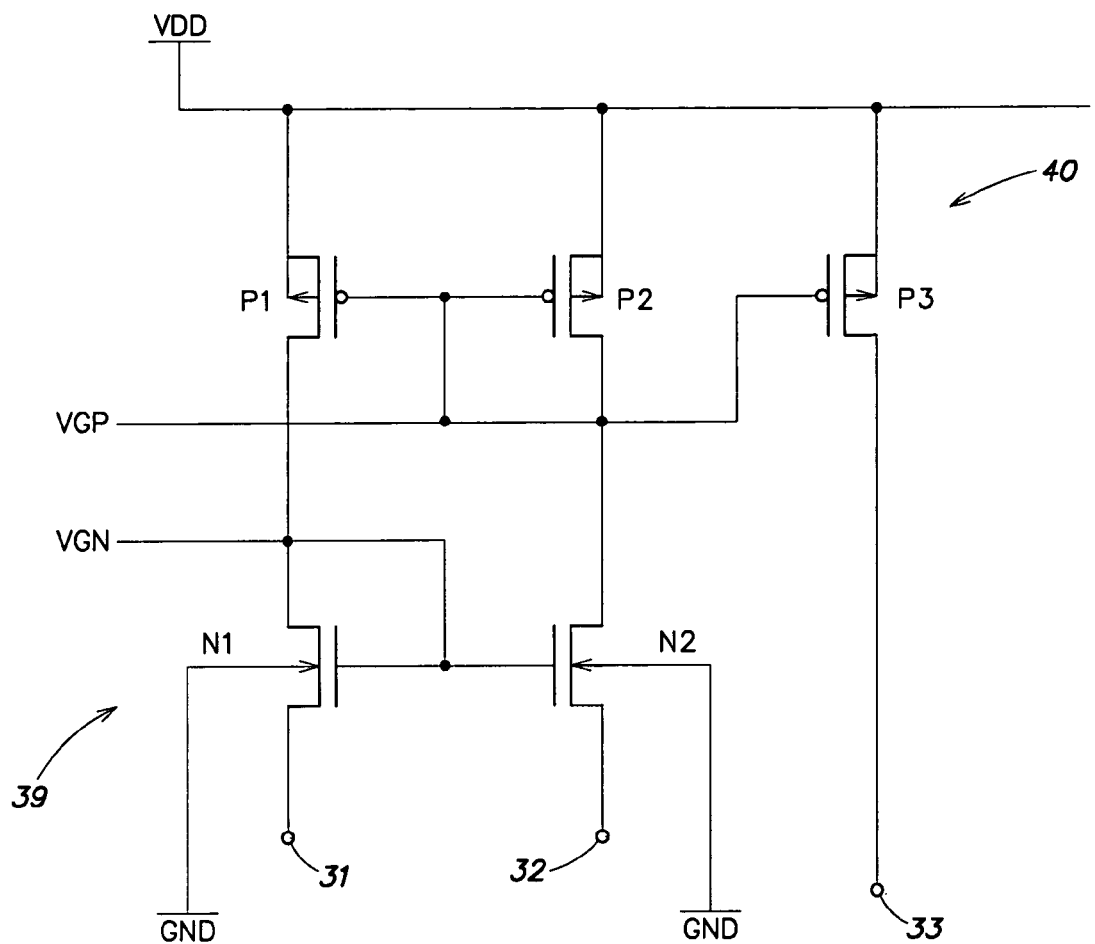
FIG. 4 illustrates an embodiment of an element of a sensor of a voltage varying along with temperature according to the present invention.

FIG. 4 shows a preferred embodiment of a current mirror 40 and of a voltage-copying element 39 according to the present invention.

According to this embodiment, multiple current source 40 is formed of a so-called Wilson mirror. Such a mirror includes the parallel connection, from high supply rail $V_{DD}$, of three P-channel MOS transistors P1, P2, and P3 having their sources connected to supply $V_{DD}$. The respective drains of transistors P1 and P2 of the first two branches of the sensor are connected to the respective drains of two N-channel MOS transistors, respectively N1 and N2. The respective sources of transistors N1 and N2 are connected to terminals 31 and 32. On the side of the third branch of the current mirror (transistor P3), the drain of transistor P3 is directly connected to terminal 33, and thus to resistor 38 (FIG. 3).

The gates of transistors P1, P2, and P3 are interconnected and are intended to receive a control signal $V_{GP}$, the gate and drain of transistor P2 being further interconnected. On the side of the second stage, the respective gates of the N-channel transistors are interconnected and intended to receive a control signal $V_{GN}$. Further, the gate and drain of transistor Ni are interconnected.

According to a preferred embodiment of the present invention, the circuit illustrated in FIG. 4 is integrated with the temperature sensor shown in FIG. 1. This has the advantage of making the sensor operation independent from current I.

According to a preferred embodiment of the present invention, an overconsumption of the temperature sensor is avoided by providing a generation of control signals $V_{GN}$ and $V_{GP}$ only when necessary by means of a specific starting circuit.

Figure 5:
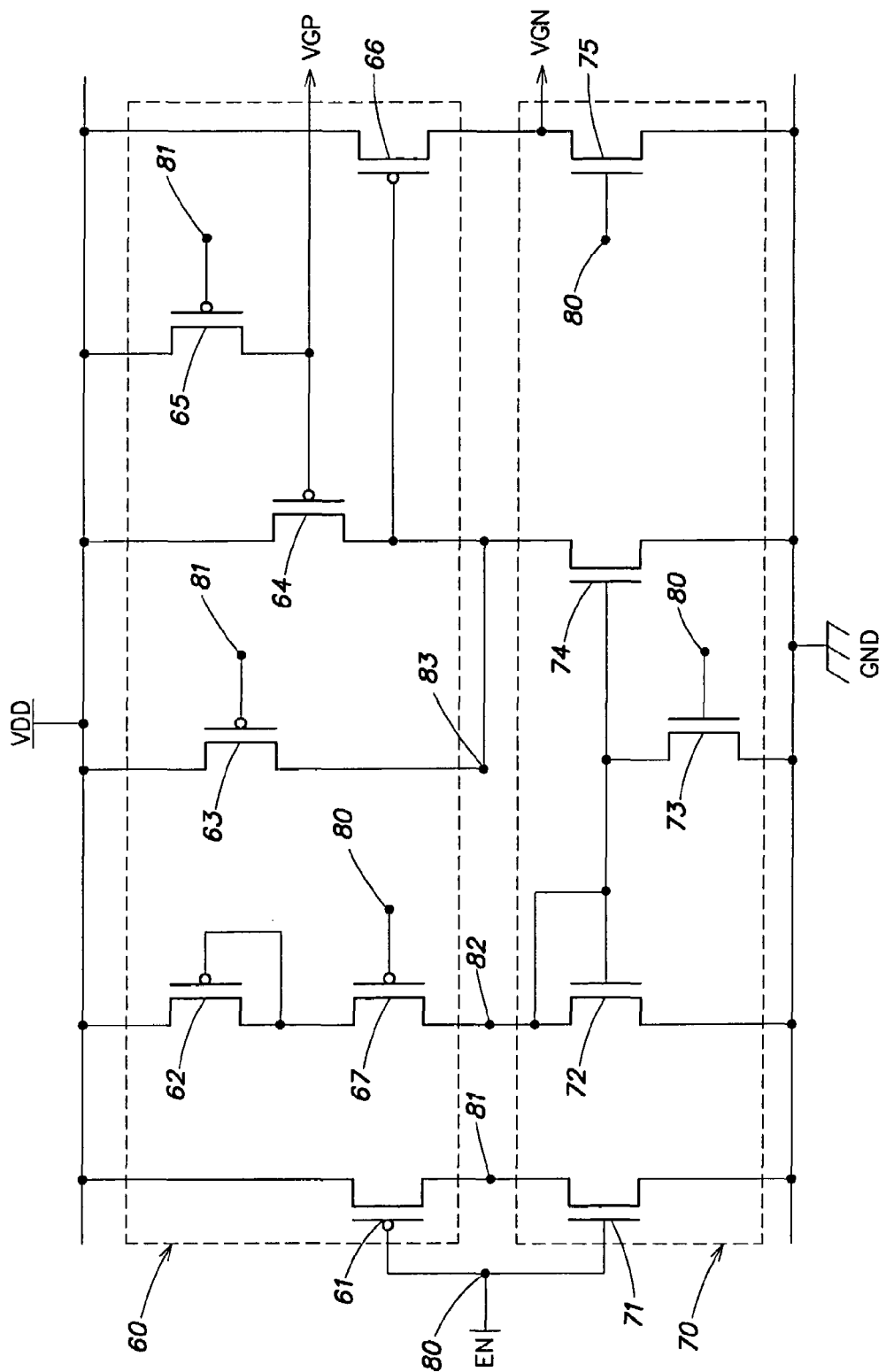
FIG. 5 illustrates another element of a sensor of a voltage varying along with temperature according to the present invention.

FIG. 5 shows an embodiment of such a starting circuit.

This circuit includes two stages, interposed between high supply $V_{DD}$ and reference supply GND, an input terminal of a control or enable signal EN, and two output terminals $V_{GP}$, $V_{GN}$. A first stage is formed of P-type MOS transistors and a second stage is formed of N-type MOS transistors. Six P-channel MOS transistors 61 to 66 have their sources and their bulks connected to high supply $V_{DD}$. The gate of transistor 64 and the drain of transistor 65 form output terminal $V_{GP}$ of the circuit. The drain of transistor 61 is connected to the gates of transistors 63 and 65. The gate of transistor 61 is connected to the gate of a P-channel MOS transistor 67 having its source connected to the drain and to the gate of transistor 62. It should be noted that the bulk of transistor 67 is connected to high supply $V_{DD}$. Finally, the drains of transistors 63 and 64 are interconnected and form a terminal 83 of connection to the second stage 70.

The N-type stage includes five N-channel MOS transistors 71, 72, 73, 74, and 75, having all their sources connected to reference supply rail GND. The gates of transistors 71, 73, and 75 are connected to terminal 80. The drain of transistor 71 is connected to the drain of transistor 61. The gates of transistors 72 and 74 are interconnected to the drain of transistor 73 and form a terminal 82 of connection to the first stage 60. The drain of transistor 74 is connected to terminal 83. The drain of transistor 75 is connected to terminal $V_{GN}$.

An advantage of such a device is that the testing circuit will only consume power when the testing is enabled by enable control signal EN, for example, from the external tool.

Of course, the present invention is likely to have various alterations, modifications, and improvements which will readily occur to those skilled in the art. In particular, specific structures of voltage-copying element 39 and of the source of three equal currents 40 have been described as a non-limiting example only. Those skilled in the art will be able to modify their structure in any appropriate manner to obtain the searched function.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. An integrated circuit comprising a temperature sensor, the temperature sensor comprising:
   a first diode-connected PNP-type bipolar transistor connected between a first terminal and a second terminal of the sensor, the second terminal configured to be connected to a reference supply rail;
   a resistive element and a second diode-connected PNP-type bipolar transistor, connected in series between a third terminal of the sensor and the second terminal, the second bipolar transistor being larger than the first bipolar transistor;
   a current-to-voltage conversion element connected between a fourth terminal and the second terminal, the first and third terminals being configured to be connected by a voltage-copying element and the first, third, and fourth terminals being configured to receive identical currents; and
   means for supplying power to the first, third and fourth terminals in response to an enable control signal so that the temperature sensor does not consume power when power is being supplied to the integrated circuit and the enable control signal is inactive.

2. The integrated circuit of claim 1, in which said means for supplying comprises, integrated, three mirror-connected current sources for providing the identical current to the first, third, and fourth terminals, the voltage-copying element being also integrated to the sensor.

3. The integrated circuit of claim 1, wherein the voltage-copying element comprises a voltage mirror formed of two N-channel MOS transistors.

4. The integrated circuit of claim 1, wherein the current-to-voltage conversion element comprises a resistor.

5. The integrated circuit of claim 1, wherein a voltage at the fourth terminal corresponds to a temperature of the integrated circuit.

6. The integrated circuit of claim 1, wherein the temperature sensor measures a temperature of the integrated circuit during an operational testing phase of the integrated circuit.

7. An integrated circuit comprising a temperature sensor for testing an operating temperature range of said circuit, said sensor comprising:
   a first diode-connected PNP-type bipolar transistor connected between a first terminal and a second terminal of the sensor, the second terminal intended to be connected to a reference supply rail;
   a resistive element and a second diode-connected PNP-type bipolar transistor, connected in series between a third terminal of the sensor and the second terminal, the second bipolar transistor being larger than the first one;
   a current-to-voltage conversion element connected between a fourth terminal and the second terminal, the first and third terminals being intended to be connected by a voltage-copying element and the first, third, and fourth terminals being intended to each receive an identical current; and
   control elements to supply power to the first, third and fourth terminals in response to an enable control signal so that the temperature sensor does not consume power when power is being supplied to the integrated circuit and the enable control signal is inactive.

8. The integrated circuit of claim 1, in which said control elements comprise integrated, three mirror-connected current sources for providing the identical current to the first, third, and fourth terminals, the voltage-copying element being also integrated to the sensor.

9. The integrated circuit of claim 1, wherein the voltage-copying element is a voltage mirror formed of two N-channel MOS transistors.

10. The integrated circuit of claim 1, wherein the current-to-voltage conversion element is a resistor.

11. An integrated circuit including a temperature sensor comprising:
   a first diode-connected PNP-type bipolar transistor connected between a first terminal and a second terminal of the sensor, the second terminal configured to be connected to a reference supply rail;
   a resistive element and a second diode-connected PNP-type bipolar transistor, connected in series between a third terminal of the sensor and the second terminal, the second bipolar transistor being larger than the first bipolar transistor; and
   a current-to-voltage conversion element connected between a fourth terminal and the second terminal;
   a voltage-copying element connected between the first and third terminals;

mirror-connected current sources connected to provide identical currents to the first, third, and fourth terminals; and control elements to supply power to the current sources in response to an enable control signal so that the temperature sensor does not consume power when power is being supplied to the integrated circuit and the enable control signal is inactive.

12. The integrated circuit of claim 11, wherein a voltage at the fourth terminal corresponds to a temperature of the integrated circuit.

13. The integrated circuit of claim 11, wherein the temperature sensor measures a temperature of the integrated circuit during an operational testing phase of the integrated circuit.

14. A method for testing an operating temperature range of an integrated circuit comprising a temperature sensor comprising: a first diode-connected PNP-type bipolar transistor connected between a first terminal and a second terminal of the sensor, the second terminal intended to be connected to a reference supply rail; a resistive element and a second diode-connected PNP-type bipolar transistor, connected in series between a third terminal of the sensor and the second terminal, the second bipolar transistor being larger than the first one; a current-to-voltage conversion element connected between a fourth terminal and the second terminal, the first and third terminals being intended to be connected by a voltage-copying element and the first, third, and fourth terminals being intended to each receive an identical current, the method comprising:

testing an operating range of the integrated circuit, including operating the integrated circuit at a plurality of temperature ranges and measuring a voltage across the current-to-voltage conversion element for each of the plurality of temperature ranges; and controlling the power consumed by the temperature sensor in response to an enable control signal so that the temperature sensor does not consume power when power is being supplied to the integrated circuit and the enable control signal is inactive.

15. A method of determining a temperature of an integrated circuit during a testing phase, the method comprising:

providing the integrated circuit with a temperature sensor comprising:

a first diode-connected PNP-type bipolar transistor connected between a first terminal and a second terminal of the sensor, the second terminal configured to be connected to a reference supply rail;

a resistive element and a second diode-connected PNP-type bipolar transistor, connected in series between a third terminal of the sensor and the second terminal, the second bipolar transistor being larger than the first bipolar transistor;

a current-to-voltage conversion element connected between a fourth terminal and the second terminal, the first and third terminals being connected by a voltage-copying element and the first, third, and fourth terminals receiving identical currents, wherein a voltage at the fourth terminal represents temperature;

testing an operating range of the integrated circuit, including operating the integrated circuit at a plurality of temperatures; and measuring the voltage at the fourth terminal for each of the plurality of temperatures; and controlling the power consumed by the temperature sensor in response to an enable control signal so that the temperature sensor does not consume power when power is being supplied to the integrated circuit and the enable control signal is inactive.

16. The method of claim 15, further comprising:

supplying power to the temperature sensor; and enabling operation of the temperature sensor independently from supplying the power.

* * * * *